(12) United States Patent
Matsuno et al.

(10) Patent No.: US 6,803,622 B2
(45) Date of Patent: Oct. 12, 2004

(54) SEMICONDUCTOR DEVICE AND METHOD OF MANUFACTURING THE SAME

(75) Inventors: Koichi Matsuno, Mie (JP); Junichi Shiozawa, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/274,871

(22) Filed: Oct. 22, 2002

(65) Prior Publication Data

US 2004/0036107 A1 Feb. 26, 2004

(30) Foreign Application Priority Data

Aug. 26, 2002 (JP) ........................................ 2002-245727

(51) Int. Cl.7 .............................................. H01L 29/72
(52) U.S. Cl. ..................... 257/314; 257/506; 257/508; 257/509; 257/512
(58) Field of Search ................................ 257/314, 506, 257/508, 509, 512

(56) References Cited

U.S. PATENT DOCUMENTS 6,228,717 B1    5/2001  Hazama et al.
2003/0052384 A1 *  3/2003  Sato et al. .................. 257/506

FOREIGN PATENT DOCUMENTS

JP    09-017890    1/1997
JP    09-017891    1/1997

OTHER PUBLICATIONS

Iguchi, T. et al., "Semiconductor Device and Method of Manufacturing A Semiconductor Device", U.S. Application Serial No.: 10/180,463, filed on Jun. 27, 2002.

* cited by examiner

*Primary Examiner*—Edward Wojciechowicz
(74) *Attorney, Agent, or Firm*—Finnegan, Henderson, Farabow, Garrett & Dunner, L.L.P.

(57) ABSTRACT

A semiconductor device includes a semiconductor substrate; a first insulating film formed on the top surface of the semiconductor substrate; a first gate electrode formed on the first insulating film; a second insulating film having a three-layered structure made by sequentially depositing a first kind of insulating layer, a second kind of insulating layer and a first kind of insulating layer on the first gate electrode; a second gate electrode formed on the second insulating film; a first plane including the side surface of the first gate electrode or the side surface of the second gate electrode; and a second plane including the side surface of the second kind of insulating layer, wherein distance between said first plane and said second plane does not exceed 5 nm.

11 Claims, 13 Drawing Sheets

RTO処理後

RTO処理前

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2002-245727, filed on Aug. 26, 2002, the entire contents of which are incorporated herein by reference.

FIELD OF THE INVENTION

This invention relates to a semiconductor device and a method of manufacturing the same.

BACKGROUND OF THE INVENTION

Flash memory devices have recently been brought into frequent use as semiconductor storage devices. A conventional semiconductor memory device having Flash memory is shown in FIGS. 14 and 15.

FIGS. 14 and 15 are enlarged cross-sectional views of a memory region of the conventional semiconductor device 100. The section shown in FIG. 14 corresponds to the section taken along the X—X line of FIG. 1, and the section shown in FIG. 15 corresponds to the section taken along the Y—Y line of FIG. 1.

As shown in FIG. 14, STIs (shallow trench isolation) 40 for isolating element-area are formed in a semiconductor substrate 10. An element-forming region 45 exists between every adjacent STIs 40. On the top surface of each element-forming region 45, a gate insulating film 20 is formed, and a floating gate electrode 35 is formed on the gate insulting film 20. The floating gate electrode 35 is made up of doped polysilicon layers 30, 60. The top surface and the side surfaces of the floating gate electrode 35 are coated by an insulating film 70. Therefore, the floating gate electrode 35 is encircled by insulating films and held floating. The insulating film 70 is a so-called ONO film made by stacking a silicon oxide film, a silicon nitride film and a silicon oxide film. Formed on the insulting film 70 is a control gate electrode 80. The control gate electrode 80 is made of doped silicon. A silicide (for example, WSi) layer 90 is formed on the control gate electrode 80. A silicon nitride film 95 is formed on the silicide layer 90 and a silicon oxide film 98 is further formed on the silicon nitride film 95.

FIG. 15 is a cross-sectional view of the semiconductor device 100 taken along a plane being perpendicular to the extending direction of the floating gate electrode 35 and the control gate electrode 80 shown in FIG. 14. As shown in FIG. 15, a silicon oxide film 99 is formed on side surfaces of the floating gate electrode 35 and the control gate electrode 80.

Next referring to FIGS. 17A and 17B, a method of manufacturing the conventional semiconductor device 100 is briefly explained from the step after formation of the silicon oxide film 98. FIGS. 17A and 17B correspond to the section along the Y—Y line of FIG. 1.

As shown in FIG. 17A, after a layer such as the silicon oxide film 98 is formed by the conventional method, the silicon oxide film 98 and the silicon nitride film 95 are patterned by photolithography and RIE (reactive ion etching). After that, using the silicon nitride film 95 as a mask, the silicide layer 90, the doped polysilicon layer (control gate electrode) 80, the insulating film 70, the doped polysilicon layers 30, 60 and the gate insulating film 20 are selectively etched by RIE.

Thereafter, the structure is annealed in an oxygen atmosphere by RTO (rapid thermal oxidation) to form the silicon oxide film 99 as shown in FIG. 17B.

FIGS. 16A and 16B show a cross-sectional structure of the semiconductor device 100 along a boundary portion $C_1$, between the floating gate electrode 35 and the control gate electrode 80. FIG. 16A shows its aspect before the RTO processing and FIG. 16B shows its aspect after the RTO processing.

Before the RTO processing, side surfaces of the floating gate electrode 35, insulating film 70 and control gate electrode 80 are flat as shown in FIG. 16A.

After the RTO processing, however, a considerable thickness of the silicon oxide film 99 grows on side surfaces of the floating gate electrode 35 and the control gate electrode 80, but almost no silicon oxide film grows on the side surface of the silicon nitride film 70b. That is, the silicon oxide film 99 grows locally. As a result, the silicon oxide film on the side surfaces of the floating gate electrode 35, the control gate electrode 80 and the silicon nitride film 70b becomes significantly uneven in thickness. Therefore, distance $d_1$, between the plane of the side surface of the silicon nitride film 70b and the plane of the side surfaces of the floating gate electrode 35 and the control gate electrode 80 becomes large.

Since the distance $d_1$ increases after the RTO processing while the distance $d_1$ is substantially zero before the RTO processing, a large mechanical stress is produced at that end of the insulating film 70 in the boundary portion $C_1$, and this stress transmits to the gate insulating film 20 through the floating gate electrode 35. In general, the gate insulating film 20 functions as a tunnel gate oxide film when the floating gate electrode 35 receives or delivers electric charges. Therefore, if a stress rises in the gate insulating film 20, then electron traps are induced at that end of the gate insulating film 20. This results in a problem such as fluctuation of the threshold voltage of the device or degradation of the electric charge mobility.

In general, as shown in FIG. 8, the greater the stress rising in the gate insulating film 20, the electron traps increase. And as shown in FIG. 10, the change of the threshold voltage increases proportionally to the electron traps. Therefore, it is undesirable that the stress acting on the gate insulating film 20 increases.

In addition to that, as shown in FIG. 9, a change of the threshold voltage after repetitive write and erase (W/E) in a nonvolatile semiconductor storage device such as flash memory is considered to occur due to an increase of electron traps. An increase of the stress acting on the gate insulating film 20 invites an increase of electron traps in the nonvolatile semiconductor storage device. Also from this viewpoint, it is not desirable that the stress applied to the gate insulating film 20 increases.

There is a demand for a semiconductor device with lower stress acting on the gate insulating film and lower electrons trapped in the gate insulating film than those of conventional devices.

BRIEF SUMMARY OF THE INVENTION

A semiconductor device according to an embodiment of the invention comprises: a semiconductor substrate; a first insulating film formed on the top surface of the semiconductor substrate; a first gate electrode formed on the first insulating film; a second insulating film having a three-layered structure made by sequentially depositing a first kind of insulating layer, a second kind of insulating layer and a first kind of insulating layer on the first gate electrode; a second gate electrode formed on the second insulating film; a first plane including the side surface of the first gate electrode or the side surface of the second gate electrode; and a second plane including the side surface of the second kind of insulating layer, wherein distance between said first plane and said second plane does not exceed 5 nm.

A method of manufacturing a semiconductor device according to an embodiment of the invention comprises:

forming a first insulating film on the top surface of a semiconductor substrate; depositing a first gate electrode material on the first insulating film; forming a second insulating film having a three-layered structure including a first kind of insulting layer, a second kind of insulating layer and a first kind of insulting layer sequentially stacked on the first gate electrode material; depositing a second gate electrode material on the second insulating film; etching the second gate electrode material, the second insulating film and the first gate electrode material in a uniform pattern to form a first gate electrode made of the first gate electrode material and to form a second electrode made of the second gate electrode material; and oxidizing at least side surfaces of the fist gate electrode, side surfaces of the second gate electrode and side surfaces of the second insulating film in an ozone ($O_3$) atmosphere.

A method of manufacturing a semiconductor device according to another embodiment of the invention comprises: forming a first insulating film on the top surface of a semiconductor substrate; depositing a first gate electrode material on the first insulating film; forming a second insulating film having a three-layered structure including a first kind of insulting layer, a second kind of insulating layer and a first kind of insulting layer sequentially stacked on the first gate electrode material; depositing a second gate electrode material on the second insulating film; etching the second gate electrode material, the second insulating film and the first gate electrode material in a uniform pattern to form a first gate electrode made of the first gate electrode material and to form a second electrode made of the second gate electrode material; and oxidizing at least side surfaces of the first gate electrode, side surfaces of the second gate electrode and side surfaces of the second insulating film in an atmosphere containing hydrogen ($H_2$) and oxygen ($O_2$).

DETAILED DESCRIPTION OF THE INVENTION

Some embodiments of the invention will now be explained below with reference to the drawings. The embodiments, however, should not be construed to limit the invention.

Figure 1:
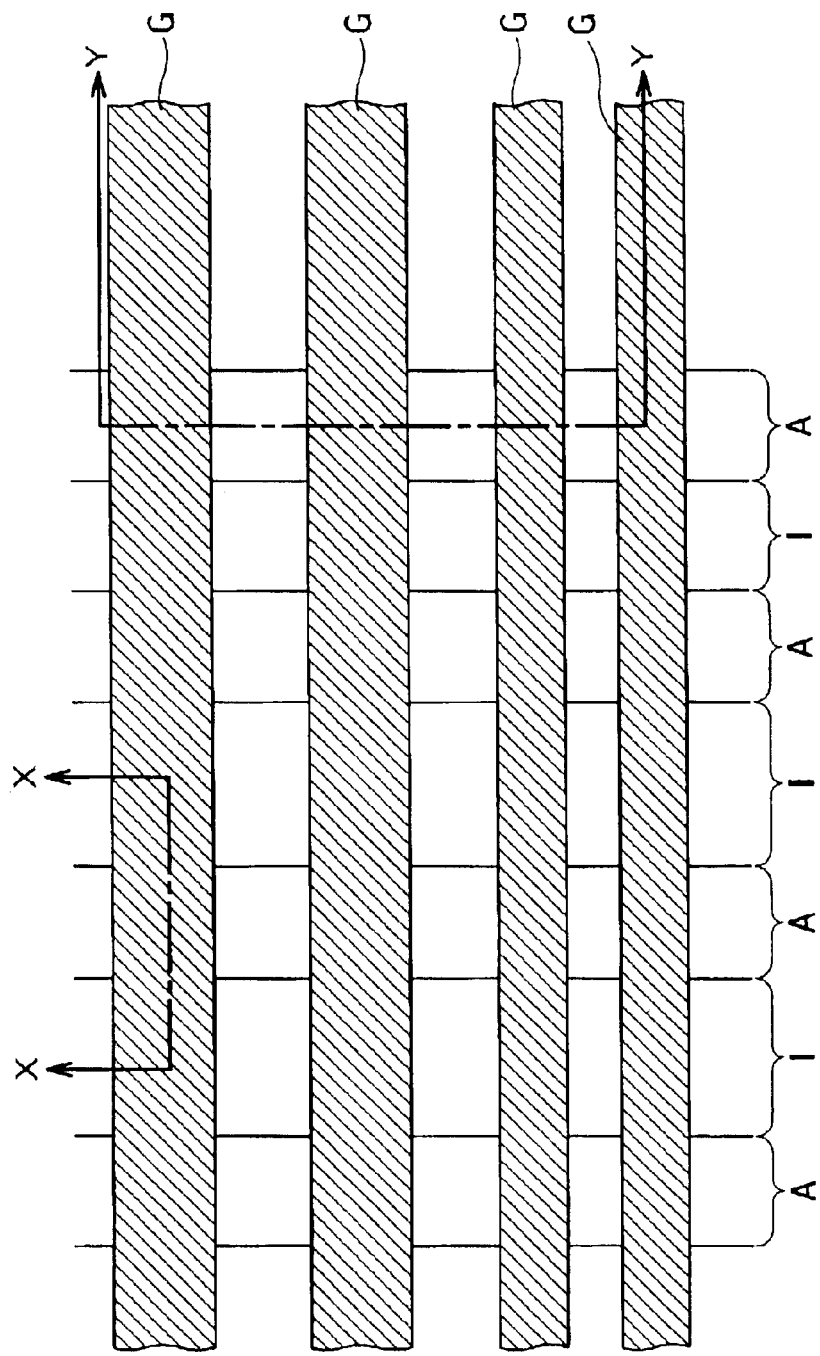
FIG. 1 is a plan view of memory regions of a semiconductor device 200 according to an embodiment of the invention.

FIG. 1 is a plan view of memory regions of a semiconductor device 200 according to an embodiment of the invention. Active regions A and element-to-element isolating regions I alternately extend in the longitudinal direction of FIG. 1. The active regions A have formed memory elements, and every adjacent active regions A are electrically insulated by an isolating region I. Gate portions G extend on the active regions A and isolating regions I in directions across these regions A and I.

Figure 2:
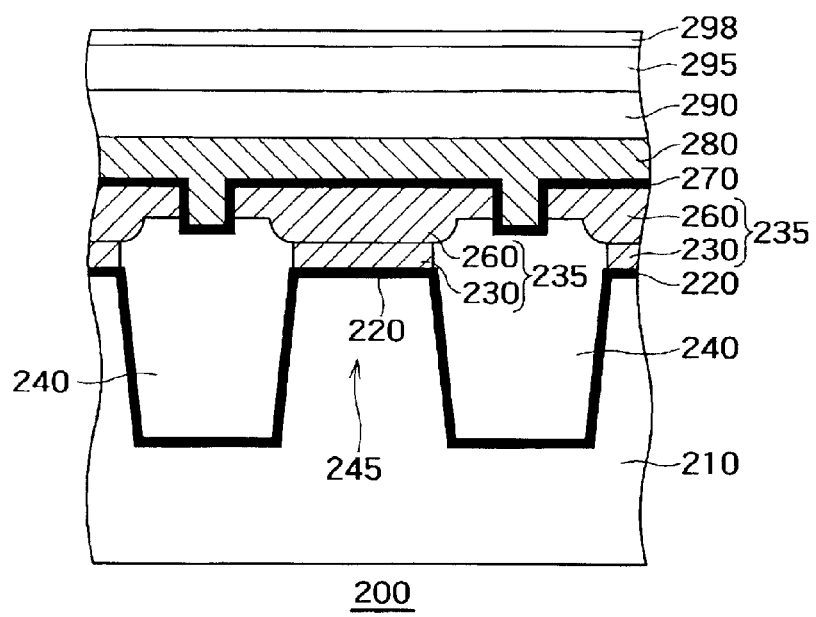
FIG. 2 is a cross-sectional view of the semiconductor device 200 taken along the X—X line of FIG. 1.

FIG. 2 is a cross-sectional view of the semiconductor device 200 taken along the X—X line of FIG. 1. The isolating regions I have formed STI 240 whereas the active regions A have formed element-forming regions 245.

The semiconductor device 200 includes a semiconductor substrate 210, gate insulating film 220 formed on the top surface of the semiconductor substrate 210, floating gate electrode 235 formed on the gate insulating film 220, insulating film 270 formed on the top surface of the floating gate electrode 235, control gate electrode 280 formed on the insulating film 270, silicide layer 290 formed on the control gate electrode 280, silicon nitride film 295 formed on the silicide layer 290, and silicon oxide film 298 formed on the silicon nitride film 295.

The floating gate electrode 235 is insulated in a floating condition from the semiconductor substrate 210 and the control gate electrode 280 because of the enclosure by the gate insulating film 220, STI 240 and insulating film 270. When a certain potential is applied to the control gate electrode 280, an electric charge is extracted from the element-forming region 245 by tunneling the gate insulating film 220 and captured by the floating gate electrode 235. Data write can be executed thereby. Holding the electric charge results in storage of data.

When a potential of the opposite polarity from that for data write is applied to the control gate electrode 280, the electric charge is discharged from the gate electrode 235 into the element-forming region 245 by tunneling the gate insulating film 220. Data erase can be executed thereby.

As such, data write and erase (W/E) are carried out by tunneling of an electric charge through the gate insulating film 220. Because of this function, the gate insulating film 220 is called a tunnel gate insulating film as well.

Figure 3:
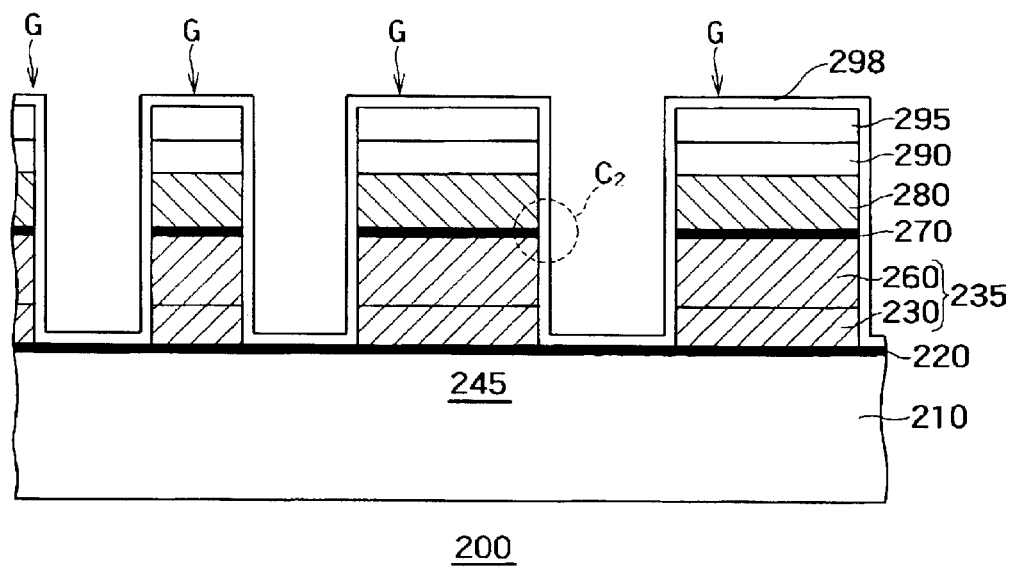
FIG. 3 is a cross-sectional view of the semiconductor device 200 taken along the Y—Y line of FIG. 1.

FIG. 3 is a cross-sectional view of the semiconductor device 200 taken along the Y—Y line of FIG. 1. Since the Y—Y line extends across the gate portion G shown in FIG. 1, a section of a plurality of gate portions G appears in FIG. 3. A silicon oxide film 298 is formed on side surfaces of the floating gate electrode 235 and the control gate electrode 28. The element-forming region 245 has formed a diffusion layer (not shown).

Next explained is a manufacturing method of the semiconductor device 200. FIGS. 4A through 4F and FIGS. 5A through 5C are cross-sectional views showing the manufacturing method of the semiconductor device 200 in the order of its steps. Cross-sectional views of FIGS. 4A through 4F correspond to those taken along the X—X line of FIG. 1.

Figure 4A:
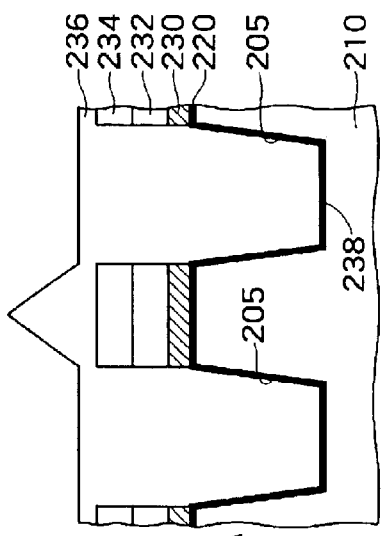
FIG. 4A is a cross-sectional view of the semiconductor device 200, which illustrates a manufacturing method thereof.

First referring to FIG. 4A, the top surface of the semiconductor substrate 210 is oxidized to form the gate insulating film 220 that is approximately 8 nm thick. Next deposited on the gate insulating film 220 are an approximately 40 nm thick doped polysilicon layer 230, approximately 90 nm thick silicon nitride film 232 and approximately 230 nm thick silicon oxide film 234 by LP-CVD (low pressure chemical vapor deposition).

After that, a resist of a predetermined pattern is formed by photolithography, and the silicon oxide film 234, silicon nitride film 232, doped polysilicon layer 230, gate insulating film 220 and semiconductor substrate 210 are selectively etched by RIE using this resist as a mask. As a result, trenches 205 are formed in the semiconductor substrate 210 as shown in FIG. 4A.

After that, the structure is annealed in an oxygen atmosphere by RTO (rapid thermal oxidation). Thereby, a silicon oxide film, approximately 6 nm thick, is formed on the silicon side walls exposed in the trenches 205.

Thereafter, a silicon oxide film 236, approximately 550 nm thick, is deposited by HDP (high density plasma).

Figure 4B:
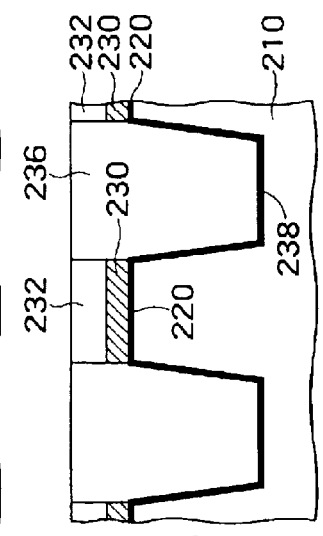
FIG. 4B is a cross-sectional view of the semiconductor device 200, which illustrates a continuous portion of the manufacturing method next to FIG. 4A.

As shown in FIG. 4B, the silicon oxide film 236 is next polished and planarization by CMP (chemical mechanical polishing) to expose the silicon nitride film 232, and thereafter annealed in a nitrogen atmosphere.

Figure 4C:
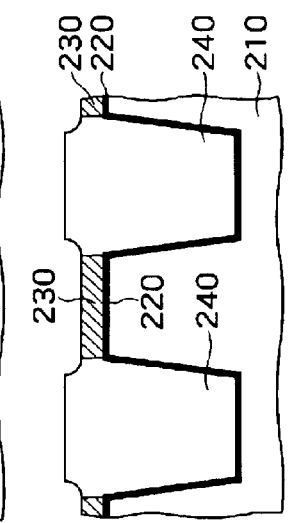
FIG. 4C is a cross-sectional view of the semiconductor device 200, which illustrates a continuous portion of the manufacturing method next to FIG. 4B.

As shown in FIG. 4C, the silicon oxide film 236 is next etched to a depth around 10 nm by buffered hydrofluoric acid (BHF) using the silicon nitride film 232 as a mask. Thereafter, the silicon nitride film 232 is removed by etching using phosphoric acid. As such, the STI 240 is made out.

Figure 4D:
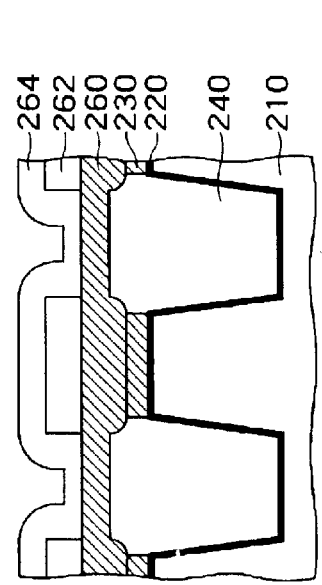
FIG. 4D is a cross-sectional view of the semiconductor device 200, which illustrates a continuous portion of the manufacturing method next to FIG. 4C.

Next as shown in FIG. 4D, an approximately 60 nm thick doped polysilicon layer 260 and an approximately 130 nm thick silicon oxide film 262 are deposited by LP-CVD. The silicon oxide film 262 is next patterned by photolithography and RIE. Then the silicon oxide film 264 is additionally deposited by LP-CVD to a thickness around 45 nm.

Figure 4E:
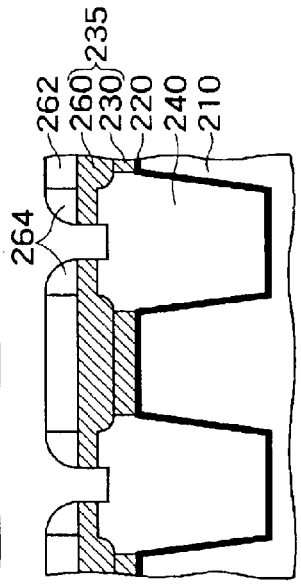
FIG. 4E is a cross-sectional view of the semiconductor device 200, which illustrates a continuous portion of the manufacturing method next to FIG. 4D.

Next as shown in FIG. 4E, the entire surface of the silicon oxide film 264 is etched by an etch-back technique. Thereafter, using the remainder silicon oxide film 264 and the silicon oxide film 262 as a mask, the doped polysilicon layer 260 is selectively etched by RIE.

Figure 4F:
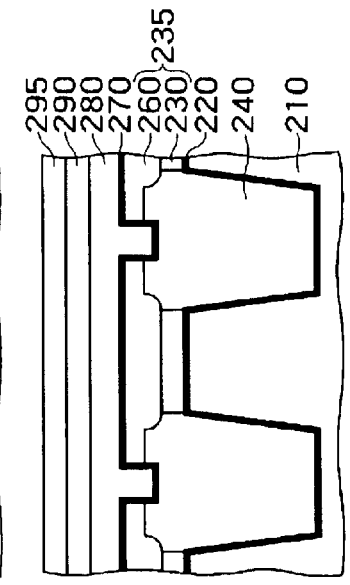
FIG. 4F is a cross-sectional view of the semiconductor device 200, which illustrates a continuous portion of the manufacturing method next to FIG. 4E.

After the etching of the doped polysilicon layer 260, the silicon oxide films 264 and 262 are removed as shown in FIG. 4F, and an insulating film 270, approximately 17 nm thick, is deposited by LP-CVD. The insulating film 270 is a film of a three-layered structure (herein below called ONO film 270) made by sequentially depositing an approximately 5 nm thick silicon oxide film, approximately 7 nm thick silicon nitride film and approximately 5 nm thick silicon oxide film. As a result, adjacent floating gate electrodes 235 are electrically insulated from each other.

After the ONO film 270 is formed, approximately 80 nm thick doped polysilicon 280 is deposited by LP-CVD. Thereafter, an approximately 70 nm thick silicide layer (such as WSi film) 290 is deposited by PVD (physical vapor deposition). Additionally, an approximately 300 nm thick silicon nitride film 295 is deposited by LP-CVD.

After that, the silicon nitride film 295 and others are processed. This process, however, does not appear in sections shown in FIGS. 4A through 4F. Instead referring FIGS. 5A through 5C, that process will be explained. Sections appearing in FIGS. 5A through 5C correspond to those taken along the Y—Y line of FIG. 1.

Figure 5A:
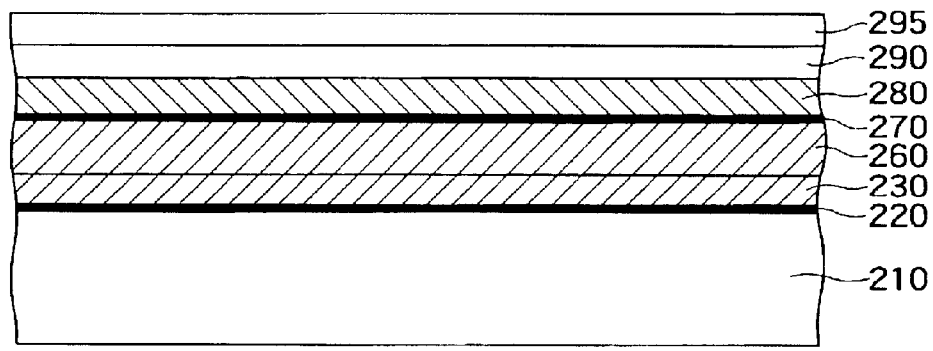
FIG. 5A is a cross-sectional view of the semiconductor device 200, which illustrates a manufacturing method thereof.

FIG. 5A illustrates a section of the element after deposition of the silicon nitride film 295.

Figure 5B:
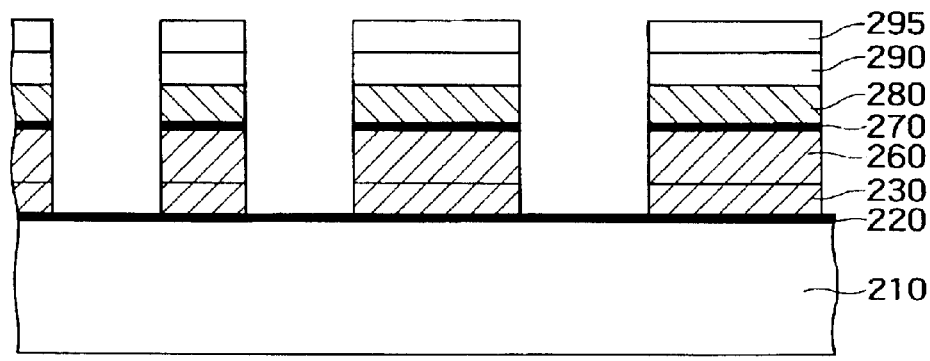
FIG. 5B is a cross-sectional view of the semiconductor device 200, which illustrates a continuous portion of the manufacturing method next to FIG. 5A.

With reference to FIG. 5B, the silicon nitride film 295 is selectively etched by photolithography and RIE. Furthermore, using the silicon nitride film 295 as a mask, the silicide layer 290, doped polysilicon 280, ONO film 270, doped polysilicon layers 260, 230 and silicon oxide film 236 are selectively etched by RIE. As a result, the gate portions G are made out (see FIG. 1).

Figure 5C:
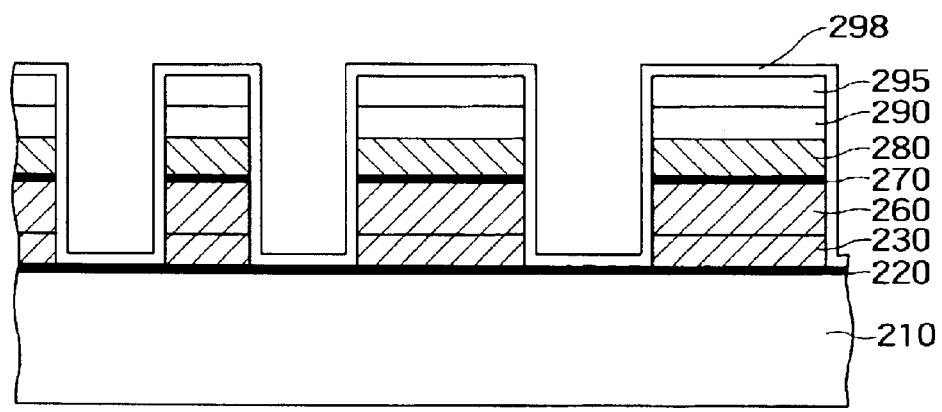
FIG. 5C is a cross-sectional view of the semiconductor device 200, which illustrates a continuous portion of the manufacturing method next to FIG. 5B.

Next as shown in FIG. 5C, side surfaces of the silicon nitride film 295, silicide layer 290, doped polysilicon (control gate electrode) 280, ONO film 270, doped polysilicon layers 260, 230 and silicon oxide film 236 are oxidized (herein below called gate oxidation as well). Gate oxidation employed here is ozone $O_3$ oxidation using an oxidation seed mainly containing radical oxygen. In this manner, the semiconductor device 200 shown in FIGS. 2 and 3 is made up and manufactured.

Figures 6A, 6B:
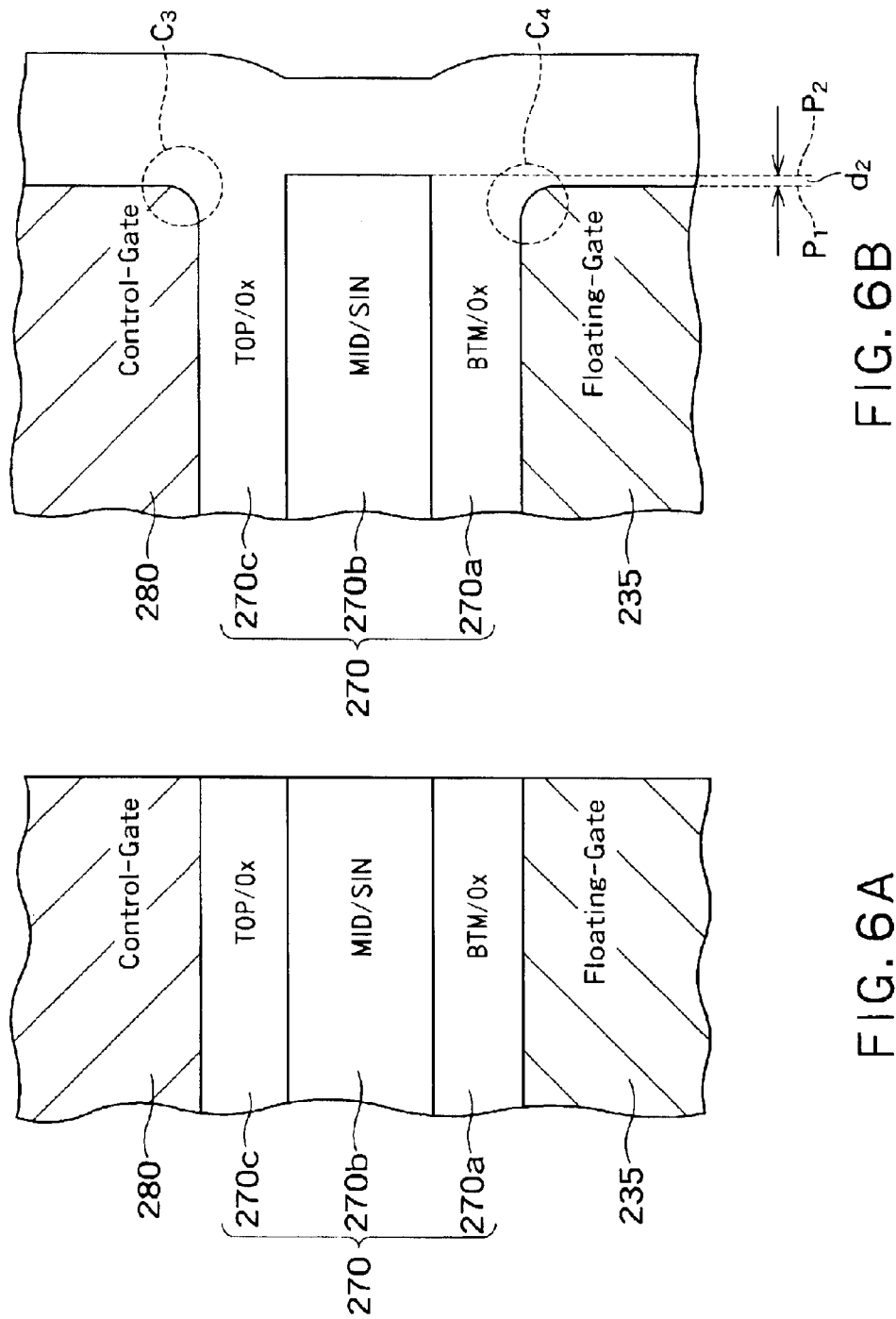
FIG. 6A is an enlarged, cross-sectional view of a boundary portion $C_2$ shown in FIG. 3 before gate oxidation.
FIG. 6B is an enlarged, cross-sectional view of the boundary portion $C_2$ shown in FIG. 3 after gate oxidation.

FIGS. 6A and 6B are enlarged, cross-sectional views of a boundary portion $C_2$ between the floating gate electrode 235 and the control gate electrode 280 shown in FIG. 3 before and after ozone ($O_3$) oxidation. FIG. 6A is the cross-sectional view of the boundary portion $C_2$ before the ozone oxidation, whereas FIG. 6B is the cross-sectional view after the ozone oxidation.

Before the oxidation, side surfaces of the control gate electrode 280, floating gate electrode 235 and silicon nitride film 270 are flat as shown in FIG. 6A.

Figure 16B:
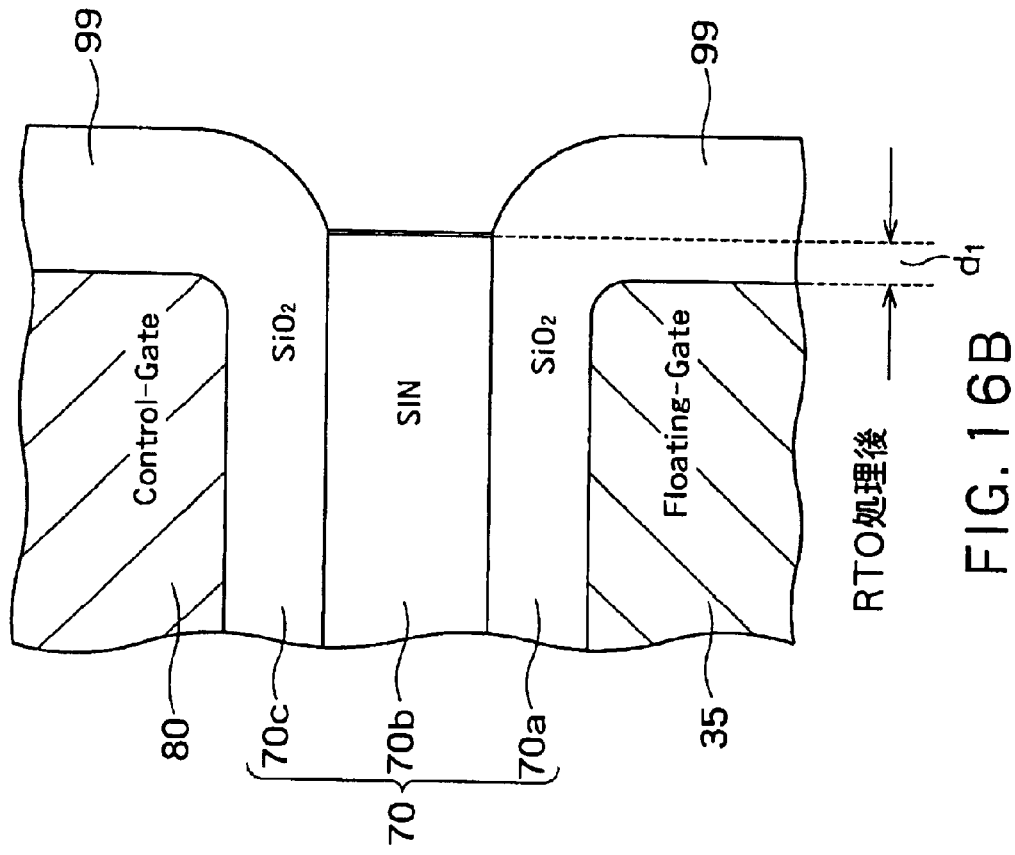
FIG. 16B is an enlarged, cross-sectional view of the boundary portion $C_1$ shown in FIG. 15 after gate oxidation.
Figure 16A:
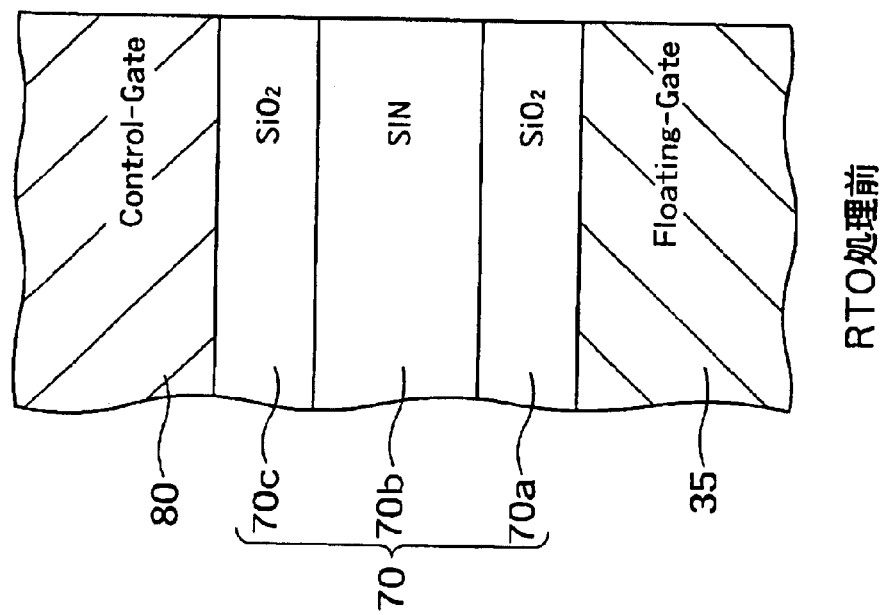
FIG. 16A is an enlarged, cross-sectional view of a boundary portion $C_1$ shown in FIG. 15 before gate oxidation.

In case that dry oxidation by RTO is used in the gate oxidation process as it was in the conventional technique, side surfaces of the silicon nitride film 70b are not oxidized (see FIG. 16B). In the instant embodiment, however, using ozone oxidation in the gate oxidation process, side surfaces of the silicon film 270b in the ONO film 270 are oxidized as shown in FIG. 6B. Therefore, distance $d_2$ between the plane $P_1$ containing side surfaces of the control gate electrode 280 and the silicon nitride film 270b and the plane $P_2$ containing a corresponding side surface of the silicon nitride film 270b of the ONO film 270 is smaller than the corresponding distance $d_1$ in the conventional technique. As such, the instant embodiment decreases the stress applied to the end portion of the ONO film 270.

The strong oxidation of side surfaces of the silicon nitride film 270b in this manner contributes to preventing the end portion of the ONO film 270 from thinning. It results in reducing the stress applied to the end portion of the ONO film 270 and hence reducing the stress to the gate oxide film 220.

Although this embodiment employs ozone ($O_3$) oxidation in the gate oxidation process, another oxidation technique of generating radical oxygen by making hydrogen $H_2$ and oxygen $O_2$ interact under a high temperature and a low pressure will also results in the same effect.

Figure 7:
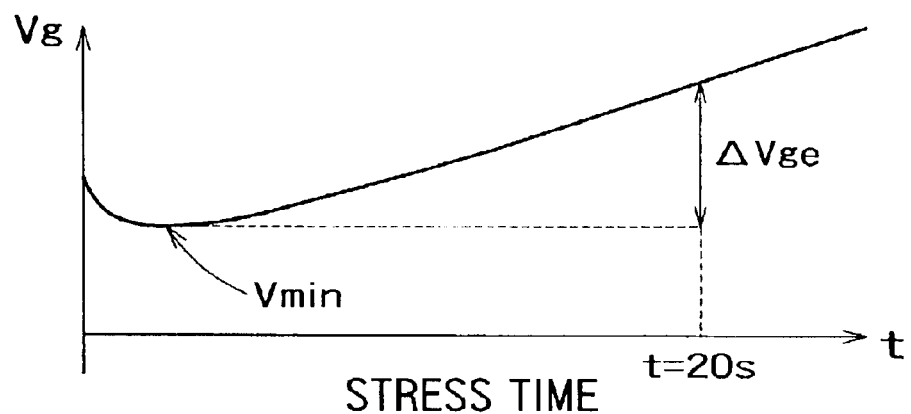
FIG. 7 is a graph showing changes of quantity of electron traps with stress time.

FIG. 7 is a typical graph that shows the constant current stress time and the voltage Vg applied to the gate for maintaining the constant current. That is, a constant current stress about 0.1 A/cm² is applied to the gate insulating film 220 for 20 seconds. In other words, an electric charge around 2 C/cm² is injected to the gate insulating film 220.

In general, when the constant voltage stress time "t" is long, Vg once decreases and thereafter starts rising. Assume here that the minimum value of Vg is "Vmin" and Vg is "V20s" when the time t is 20 seconds. Let the electron traps ΔVge be defined by "V20s-Vmin".

Figure 8:
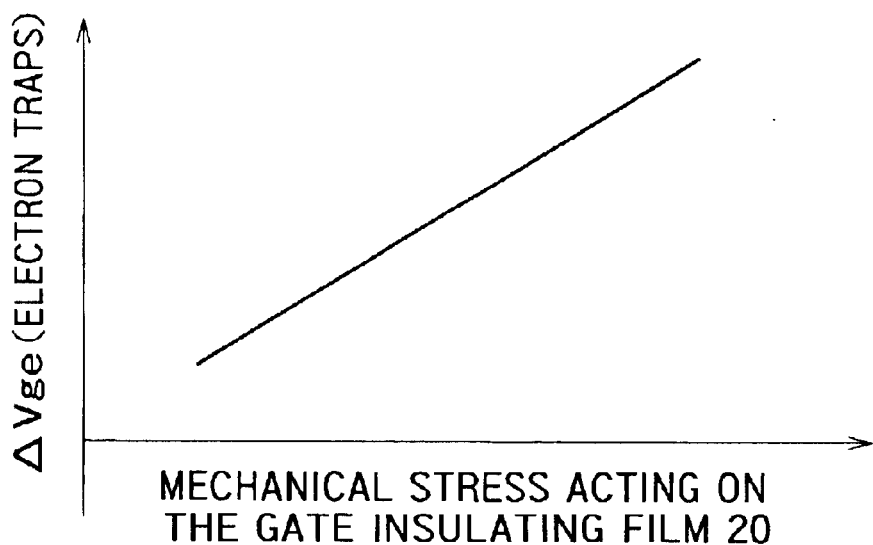
FIG. 8 is a typical graph showing relationship between mechanical stress acting upon the gate insulating film 220 and electron traps $\Delta$Vge.

FIG. 8 is a typical graph showing relationship between mechanical stress acting upon the gate insulating film 220 and electron traps ΔVge. It is understood from this graph that the stress applied to the gate insulating film 220 is proportional to the electron traps ΔVge. In the semiconductor device 200 according to the instant embodiment, the stress applied to the gate insulating film 220 is smaller than conventional one, and accordingly, the electron traps ΔVge of the gate insulating film 220 are less than conventional one.

Figure 9:
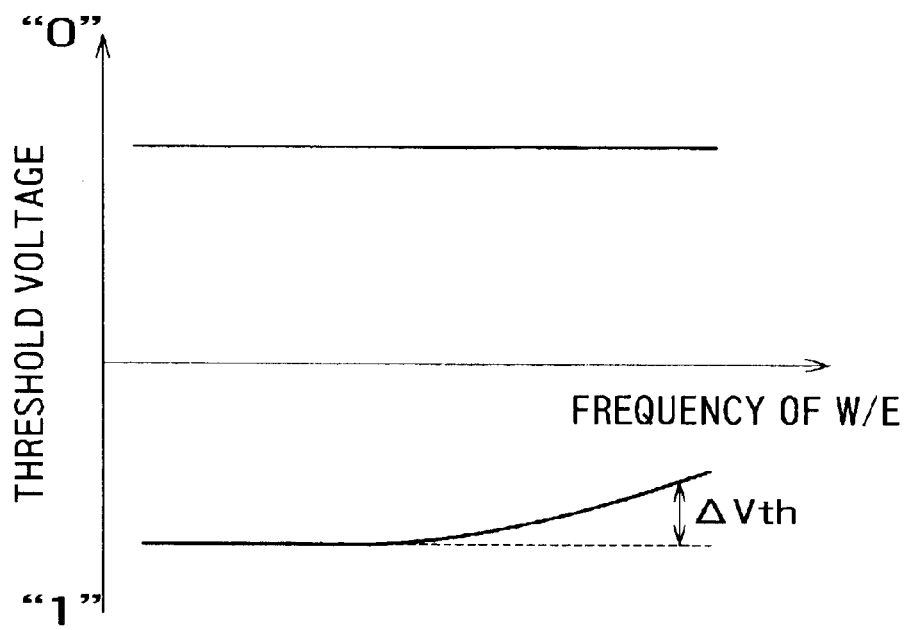
FIG. 9 is a typical graph showing relationship between W/E resistance and threshold voltage of the memory element.

FIG. 9 is a typical graph showing relationship between W/E resistance and threshold voltage of the memory element. It is understood from this graph that the write threshold voltage of the memory element varies as the frequency of write/erase operations increase. Since this semiconductor device 200 suffers a smaller stress acting upon the gate insulating film 220 than conventional one, electron traps ΔVge are still less even after repetition of write/erase operations. Therefore, the instant embodiment can limit the threshold voltage variance ΔVth to a smaller value than conventional one.

Figure 10:
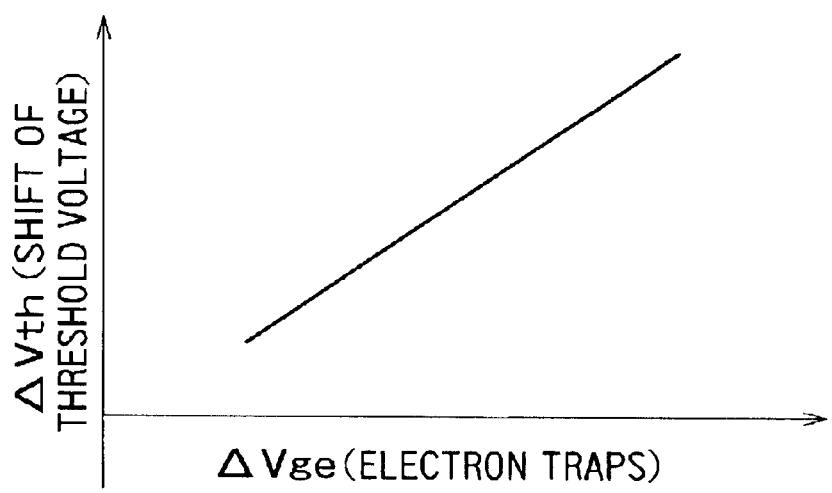
FIG. 10 is a graph showing relationship between electron traps $\Delta$Vge in a peripheral circuit element and threshold voltage changes $\Delta$Vth.

FIG. 10 is a graph showing relationship between electron traps ΔVge in a peripheral circuit element and threshold voltage changes ΔVth. It is understood from this graph that electron traps ΔVge are proportional to the threshold voltage variance ΔVth. According to this embodiment, since the stress applied to the gate insulating film 220 is smaller than conventional one, electron traps ΔVge are less. Therefore, the embodiment ensures the effect of decreasing the threshold voltage variance ΔVth in any peripheral circuit element having the gate insulating film 220.

Figure 11:
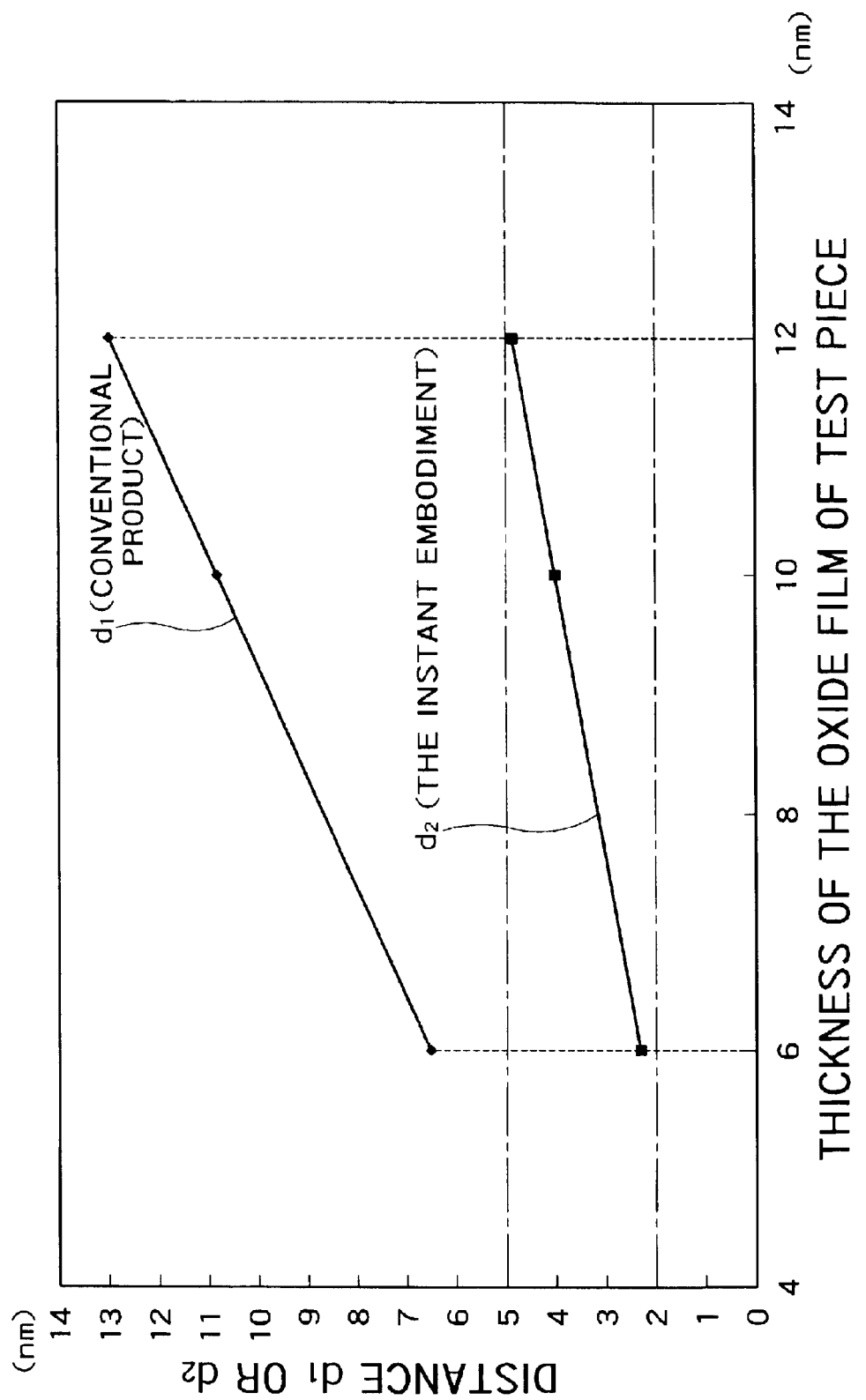
FIG. 11 is a graph showing distances $d_2$ and $d_1$ in comparison.

FIG. 11 is a graph showing the distance $d_2$ shown in FIG. 6B and the distance $d_1$ shown in FIG. 16B in comparison. The abscissa of the graph shows thickness of an oxide film formed in each test piece (TP) inserted in the gate oxidation process. The ordinate shows distances $d_1$ and $d_2$. The distance $d_2$ is apparently smaller than distance $d_1$. That is, the stress applied to the gate insulating film in this embodiment is smaller than the stress applied to the conventional gate insulating film 20.

In general, when the oxide film of TP is 6 nm thick or even thinner, electrons trapped in the gate insulating film 220 increase. Further, in case the thickness of the oxide film of TP is 12 nm or thicker, the need of high-temperature annealing over a relatively long time results in making more defects in the gate insulating film 220. Therefore, thickness of the oxide film of TP is preferably limited in the range from about 6 nm to 12 nm.

The preferable range of the thickness of the oxide film of TP in the range from about 6 nm to 12 nm automatically leads to the preferable range of the distance $d_2$ in the range from about 2 nm to 5 nm.

Curvature radii of end portions $C_3$ and $C_4$ of the floating gate electrode 235 and the control gate electrode 280 shown in broken circles in FIG. 6B are approximately 1 nm, respectively. Such large curvature radii of the end portions $C_3$ and $C_4$ contribute to relaxing the electric field converged to the end portions of the floating gate electrode 235 and the control gate electrode 280, and thereby render the ONO film 270 hard to break down.

Figure 12:
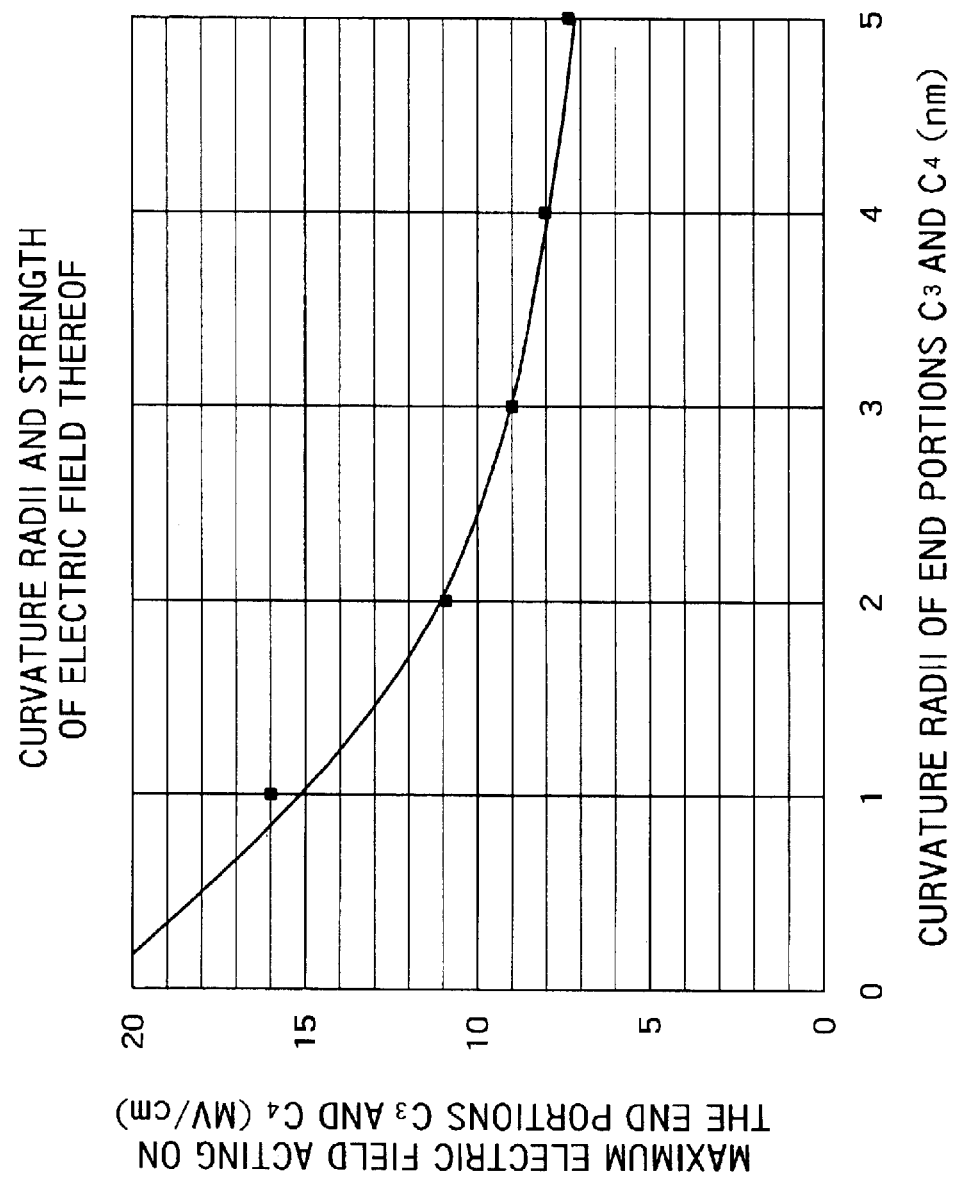
FIG. 12 is a graph showing relationship between the end portions $C_3$, $C_4$ and maximum electric field acting on the end portions $C_3$, $C_4$.

FIG. 12 is a graph showing relationship between the end portions $C_3$, $C_4$ and maximum electric field acting on the end portions $C_3$, $C_4$. The electric field increases exponentially as the curvature radius decreases. If the curvature radii of the floating gate electrode and the control gate electrode are smaller than approximately 1 nm, an electric field as high as approximately 20 MV/cm will be applied between the end portions of the floating gate electrode and the control gate electrode.

Because the curvature radii of the end portions $C_3$ and $C_4$ are approximately 1 nm or more, the electric field applied to the end portions of the floating gate electrode 235 and the control gate electrode 280 are reduced to approximately 15 MV/cm or less. As a result, the ONO film 270 becomes hard to break. The curvature radii of the end portions $C_3$ and $C_4$ are more preferably from 3 nm to 4 nm approximately to reduce the electric field applied to the end portions of the floating gate electrode 235 and the control gate electrode 280 to approximately 10 MV/cm or less, thereby to render the ONO film 270 is hard to break. Note here that FIG. 12 shows a graph in which the ONO film 270 is approximately 6 nm thick and the electric field as large as approximately 5 MV/cm is applied between the flat portion of the floating gate electrode 235 and the flat portion of the control gate electrode 280.

Figure 13:
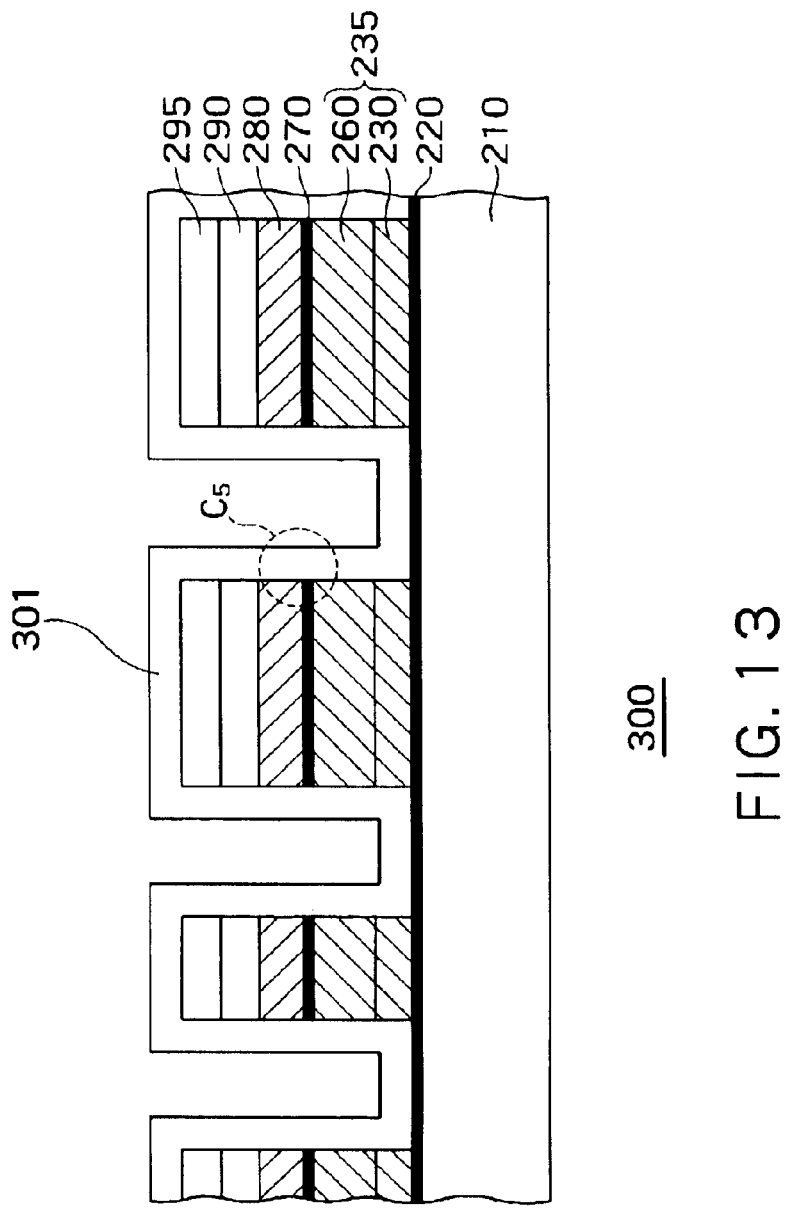
FIG. 13 is a cross-sectional view of a semiconductor device 300 according to the second embodiment of the invention.
Figure 14:
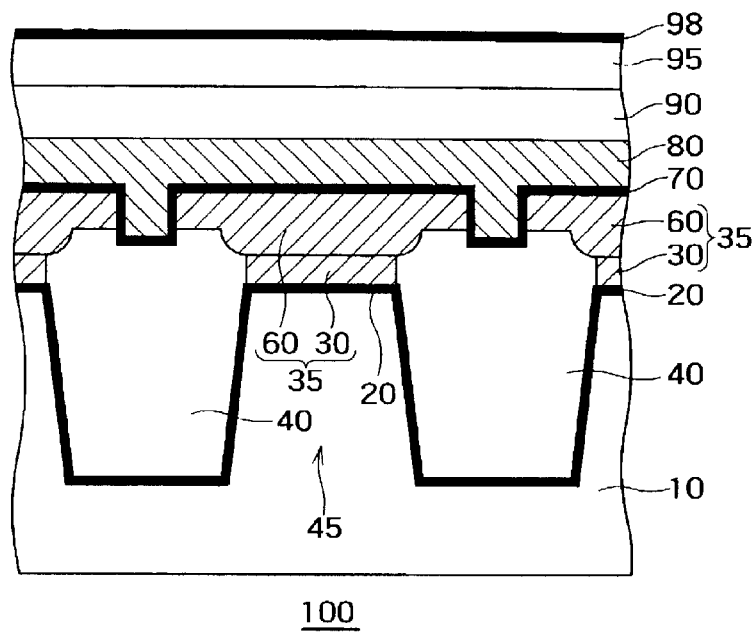
FIG. 14 is an enlarged, cross-sectional view of a memory region of a conventional semiconductor device 100.
Figure 15:
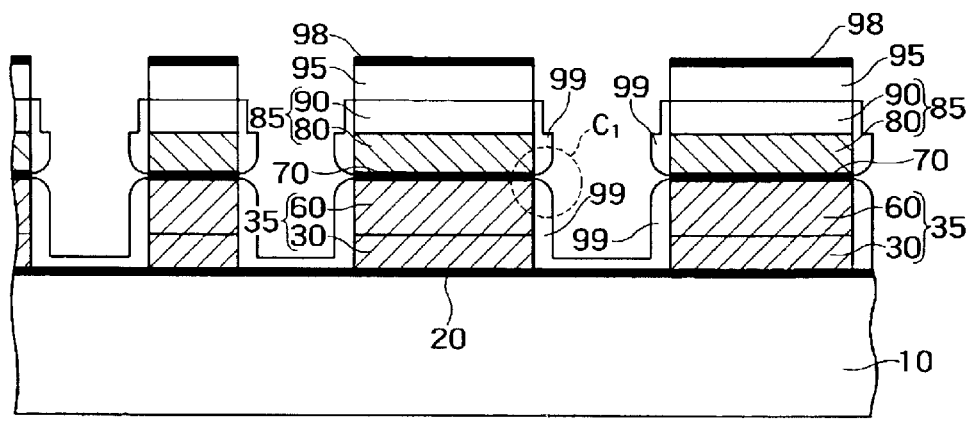
FIG. 15 is an enlarged, cross-sectional view of the memory region of a conventional semiconductor device 100.

FIG. 13 is a cross-sectional view of a semiconductor device 300 according to the second embodiment of the invention. The plan view of this embodiment appears the same as that of the first embodiment of FIG. 1. The cross-sectional view of this embodiment appears the same as that of the first embodiment shown in FIG. 2. The cross-sectional veiw of FIG. 13 corresponds to that taken along the Y—Y line of FIG. 1.

Figure 17A:
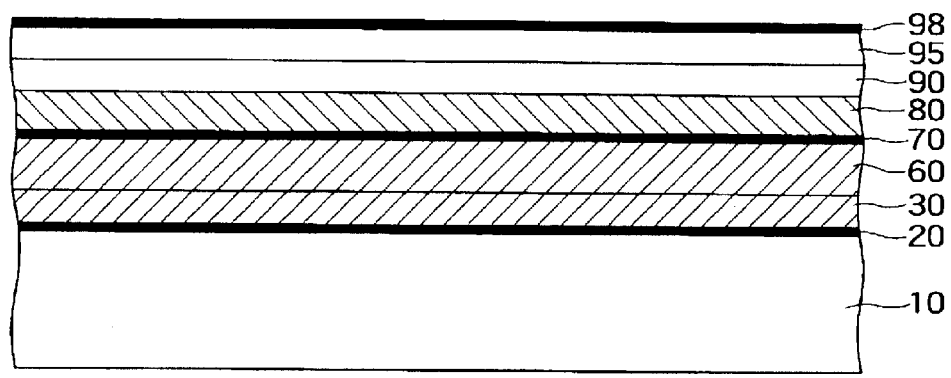
FIG. 17A is a cross-sectional view of the semiconductor device 100, which illustrates a manufacturing method thereof.
Figure 17B:
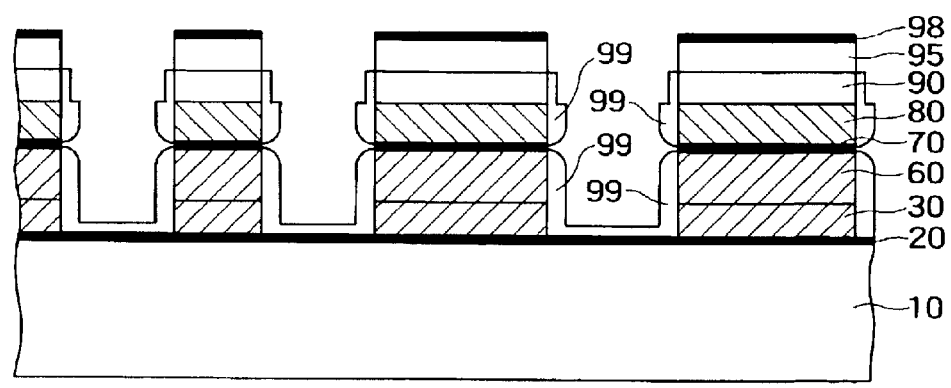
FIG. 17B is a cross-sectional view of the semiconductor device 100, which illustrates a continuous portion of the manufacturing method next to FIG. 17A.

The semiconductor device 300 shown here is manufactured by the same manufacturing process as that of the semiconductor device 200 from the step shown in FIG. 4A to the step shown in FIG. 5B. After the step of FIG. 5B, however, gate oxidation by RTO is carried out in an oxygen atmosphere. This gate oxidation is dry oxidation. The cross section of the semiconductor device 300 obtained thereby appears the same as the cross-sectional view of FIG. 17B when taken along the Y—Y line on the plan view of FIG. 1.

Next as shown in FIG. 13, a silicon oxide film 301 is formed by LP-CVD. This is for the purpose of preventing abnormal oxidation of the silicide layer (WSi layer) 290 by ozone ($O_3$) oxidation. Thereafter, gate oxidation is carried out by using ozone oxidation using radical oxygen as the main oxidation seed. As a result of this ozone oxidation, the silicon oxide film 301 is annealed, and end portions of the ONO film 270 are oxidized. Therefore, the boundary portion $C_5$ encircled by the broken circular line exhibits the same cross-sectional view as that shown in FIG. 6B. Therefore, the semiconductor device 300 according to the second embodiment also ensures the same effect as that of the semiconductor device according to the first embodiment.

The silicide layer 290 may be occasionally abnormally oxidized by ozone oxidation. However, since this embodiment forms the silicon oxide film 301 by LP-CVD prior to the ozone oxidation process, the silicide layer 290 is prevented from abnormal oxidization by ozone oxidation. Furthermore, according to the instant embodiment, gate oxidation carried out by RTO in the oxygen atmosphere contributes to eliminating defects once produced in the gate insulating film 220 near the end portions of the floating gate electrode 235 and thereby to reducing electron traps in the gate insulating film 220. Here is also the effect of excluding hydrogen from the gate insulating film 220. Moreover, since RTO is carried out under a higher temperature than ozone oxidation, the second embodiment is effective for further reducing the resistance of the silicide layer 290 than the first embodiment not using RTO.

Also when ozone oxidation used in the embodiment for gate oxidation is replaced by another oxidizing method of generating radical oxygen in lieu of ozone ($O_3$) by making hydrogen ($H_2$) and oxygen ($O_2$) interact under a high temperature and a low pressure , the same effect will be obtained.

As such, according to semiconductor device taken as one embodiment of the invention, the stress applied to the gate insulating film is less than that in the conventional device, and electrons trapped in the gate insulating film are less than those in the conventional device.

Furthermore, according to the semiconductor device manufacturing method taken as one embodiment of the invention, it is possible to the manufacture a semiconductor device lower in stress applied to the gate insulating film and less in electrons trapped in the gate insulating film than the conventional device.

What is claimed is:

1. A semiconductor device comprising:

a semiconductor substrate;

a first insulating film formed on the top surface of the semiconductor substrate;

a first gate electrode formed on the first insulating film;

a second insulating film having a three-layered structure made by sequentially depositing a first kind of insulating layer, a second kind of insulating layer and a first kind of insulating layer on the first gate electrode;

a second gate electrode formed on the second insulating film;

a first plane including the side surface of the first gate electrode or the side surface of the second gate electrode; and a second plane including the side surface of the second kind of insulating layer, wherein distance between said first plane and said second plane does not exceed 5 nm.

2. The semiconductor device according to claim 1, wherein a first end portion forming the boundary between the top surface of the first gate electrode and the side surface of the first gate electrode has a radius of curvature not smaller than 1 nm.

3. The semiconductor device according to claim 1, wherein a second end portion forming the boundary between the bottom surface of the second gate electrode and the side surface of the second gate electrode has a radius of curvature not smaller than 1 nm.

4. The semiconductor device according to claim 2, wherein a second end portion forming the boundary between the bottom surface of the second gate electrode and the side surface of the second gate electrode has a radius of curvature not smaller than 1 nm.

5. The semiconductor device according to claim 1, wherein distance between the first plane and the second plane is not smaller than 2 nm.

6. The semiconductor device according to claim 1, wherein said first kind of insulating layer is a silicon oxide film, said second kind of insulting film is a silicon nitride film, and said second insulating film is an ONO film made up of the silicon oxide films and the silicon nitride film.

7. The semiconductor device according to claim 2, wherein said first kind of insulating layer is a silicon oxide film, said second kind of insulting film is a silicon nitride film, and said second insulating film is an ONO film made up of the silicon oxide films and the silicon nitride film.

8. The semiconductor device according to claim 3, wherein said first kind of insulating layer is a silicon oxide film, said second kind of insulting film is a silicon nitride film, and said second insulating film is an ONO film made up of the silicon oxide films and the silicon nitride film.

9. The semiconductor device according to claim 5, wherein said first kind of insulating layer is a silicon oxide film, said second kind of insulting film is a silicon nitride film, and said second insulating film is an ONO film made up of the silicon oxide films and the silicon nitride film.

10. The semiconductor device according to claim 1, which is a nonvolatile storage device in which said first gate electrode is a floating gate electrode capable of holding an electric charge, and said second gate electrode is a control gate electrode for controlling injection and withdrawal of the electric charge into or from said floating gate.

11. The semiconductor device according to claim 6, which is a nonvolatile storage device in which said first gate electrode is a floating gate electrode capable of holding an electric charge, and said second gate electrode is a control gate electrode for controlling injection and withdrawal of the electric charge into or from said floating gate.

* * * * *